US007795198B2

(12) United States Patent
Lee et al.

(10) Patent No.: US 7,795,198 B2
(45) Date of Patent: Sep. 14, 2010

(54) COMPOSITION FOR REMOVING A POLYMERIC CONTAMINANT AND METHOD OF REMOVING A POLYMERIC CONTAMINANT USING THE SAME

(75) Inventors: Sang-Mi Lee, Gyeonggi-do (KR); Kwang-Shin Lim, Gyeonggi-do (KR); Jung-Dae Park, Seoul (KR); Tae-Hyo Choi, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 329 days.

(21) Appl. No.: 11/840,165

(22) Filed: Aug. 16, 2007

(65) Prior Publication Data

US 2008/0051313 A1 Feb. 28, 2008

(30) Foreign Application Priority Data

Aug. 24, 2006 (KR) ..................... 10-2006-0080382

(51) Int. Cl.
*H01L 21/02* (2006.01)

(52) U.S. Cl. ..................................... 510/175; 252/79.3

(58) Field of Classification Search ................. 510/175, 510/176; 252/79.3
See application file for complete search history.

(56) References Cited

U.S. PATENT DOCUMENTS

| | | | | |
|---|---|---|---|---|
| 6,090,721 | A * | 7/2000 | Yates | 438/745 |
| 6,235,693 | B1 | 5/2001 | Cheng et al. | |
| 6,361,712 | B1 * | 3/2002 | Honda et al. | 252/79.3 |
| 6,656,894 | B2 | 12/2003 | Peters et al. | |
| 2002/0043644 | A1 * | 4/2002 | Wojtczak et al. | 252/79.1 |
| 2005/0119143 | A1 * | 6/2005 | Egbe et al. | 510/175 |

FOREIGN PATENT DOCUMENTS

| | | |
|---|---|---|
| JP | 10-055993 | 2/1998 |
| KR | 1999-65097 | 8/1999 |

* cited by examiner

*Primary Examiner*—Gregory E Webb
(74) *Attorney, Agent, or Firm*—Mills & Onello, LLP

(57) ABSTRACT

In a composition for removing a polymeric contaminant that may remain on an apparatus for manufacturing a semiconductor device and a method of removing a polymeric contaminant using the composition, the composition includes from about 5 to 10 percent by weight of a fluoride salt, from about 5 to 15 percent by weight of an acid or a salt thereof, and from about 75 to 90 percent by weight of an aqueous solution of glycol. The composition can effectively remove the polymeric contaminant from the apparatus within a relatively short period of time, and suppress damages to parts of the apparatus.

6 Claims, 3 Drawing Sheets

COMPOSITION FOR REMOVING A POLYMERIC CONTAMINANT AND METHOD OF REMOVING A POLYMERIC CONTAMINANT USING THE SAME

CROSS-REFERENCE TO RELATED APPLICATIONS

This application claims priority under 35 U.S.C. §119 to Korean Patent Application No. 2006-80382, filed on Aug. 24, 2006, the contents of which are herein incorporated by reference in their entireties.

BACKGROUND OF THE INVENTION

1. Field of the Invention

Example embodiments of the present invention relate to compositions for removing a polymeric contaminant and methods of removing a polymeric contaminant using the compositions. More particularly, example embodiments of the present invention relate to compositions for removing a polymeric contaminant that may remain on an apparatus for manufacturing a semiconductor device and methods of removing a polymeric contaminant using the compositions.

2. Description of the Related Art

Semiconductor devices are generally manufactured by performing several unit processes such as a film deposition process, a photoresist pattern forming process, an etching process or a cleaning process, etc. For example, a thin film is formed by depositing silicon oxide, silicon nitride, metal oxide, metal nitride or metal on a semiconductor substrate. A photoresist pattern is formed by performing an exposure process and a developing process on a photoresist film that is formed on the thin film. The etching process is carried out by partially removing the thin film using the photoresist pattern as an etching mask. In the cleaning process, impurities remaining on the semiconductor substrate after performing the etching process are removed from the semiconductor substrate.

In the etching process, a polymeric contaminant generated while the thin film is partially etched is attached to an apparatus such as a dry etching apparatus. The polymeric contaminant may function as a particle contaminating the semiconductor substrate. Therefore, a process for removing the polymeric contaminant from the apparatus is required so as to prevent the semiconductor substrate from being contaminated by the polymeric contaminant.

To remove the polymeric contaminant from the apparatus, the apparatus is disassembled, and then parts of the apparatus are cleaned using a brush and a cleaning solution such as distilled water, isopropyl alcohol, a hydrofluoric aqueous solution or an ammonium hydroxide aqueous solution. However, the cleaning efficiency of this method is so poor that the polymeric contaminant attached to a part of the apparatus, e.g., a blade of a transferring arm illustrated in FIG. 1, is insufficiently removed. Moreover, it can take at least ten minutes to remove the polymeric contaminant.

Additionally, the apparatus generally includes a material such as a ceramic material, alumina, aluminum, quartz or a stainless metal. This part of the apparatus portion of the apparatus should exhibit weak acid-resistance and alkali-resistance. Accordingly, this part of the apparatus can be readily damaged when the polymeric contaminant is removed therefrom.

Furthermore, any surface unevenness of the part which is caused by the damage may promote generation of the contaminating particle. Thus, the life of the part may be shortened and the quality and the manufacturing yield of the semiconductor device may be reduced.

SUMMARY OF THE INVENTION

Example embodiments of the present invention provide compositions for removing a polymeric contaminant that can be used in cleaning an apparatus employed in manufacturing a semiconductor device and suppress damages to the part of the apparatus.

Example embodiments of the present invention provide methods of removing a polymeric contaminant from the apparatus using the above-mentioned composition.

According to one aspect of the present invention, a composition for removing a polymeric contaminant includes from about 5 to 10 percent by weight of a fluoride salt, from about 5 to 15 percent by weight of an acid or a salt thereof, and from about 75 to 90 percent by weight of an aqueous solution of glycol.

Examples of a glycol compound may include ethylene glycol, propylene glycol, butylene glycol, etc. Examples of the fluoride salt may include ammonium fluoride, tetramethylammonium fluoride, tetraethylammonium fluoride, tetrapropylammonium fluoride, tetrabutylammonium fluoride, etc. Examples of the acid may include sulfuric acid, hydrofluoric acid, nitric acid, etc. Examples of the salt may include ammonium sulfate, ammonium nitrate, etc.

In an example embodiment of the present invention, the composition may include from about 6 to 9 percent by weight of the fluoride salt, from about 6 to 12 percent by weight of the acid or the salt thereof, and from about 79 to 88 percent by weight of the aqueous solution of glycol.

According to another aspect of the present invention, there is provided a method of removing a polymeric contaminant from an apparatus used for manufacturing a semiconductor device. In the method, a composition as described above is prepared. The composition is provided to the apparatus to which the polymeric contaminant is attached, and then the polymeric contaminant is removed from the apparatus by performing a cleaning process.

Examples of the polymeric contaminant may include an oxide polymer, a carbon-based polymer, a metallic polymer, etc. Examples of the apparatus may include an etching apparatus, a deposition apparatus, a cleaning apparatus, or a part thereof. The apparatus may include a material such as a ceramic material, aluminum, quartz and a stainless metal. The cleaning process may be performed on the apparatus, parts of which are not disassembled.

According to the present invention, the composition may effectively remove the polymeric contaminant from the apparatus such as a dry etching apparatus while a cleaning process is performed using a brush. Furthermore, the composition may remove the polymeric contaminant from the apparatus within a relatively short period of time, and may suppress damages to parts of the apparatus.

BRIEF DESCRIPTION OF THE DRAWINGS

The above and other features and advantages of the present invention will become more apparent by describing in detailed example embodiments thereof with reference to the accompanying drawings, in which.

DESCRIPTION OF THE INVENTION

Figure 1:
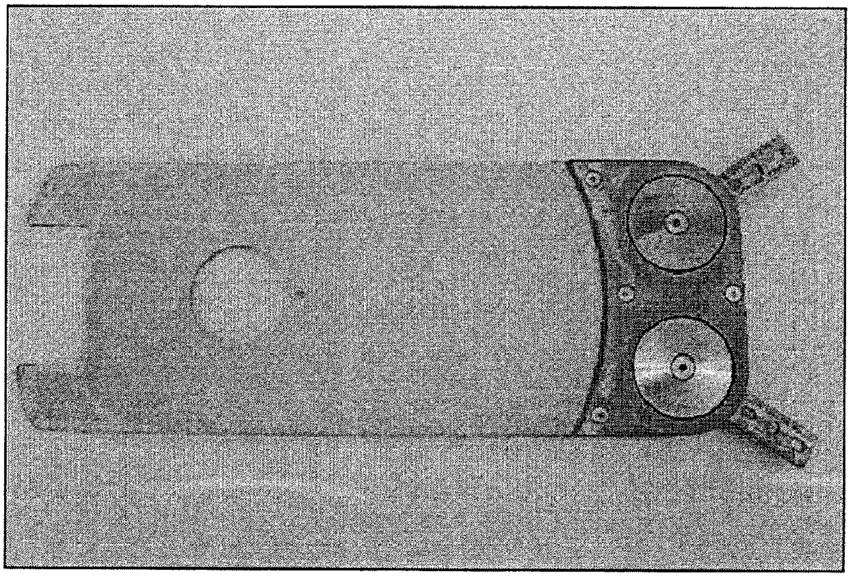
FIG. 1 is a photograph showing a blade of a transferring arm that is used for performing a semiconductor cleaning process.

The present invention is described more fully hereinafter with reference to the accompanying drawings, in which example embodiments of the present invention are shown. The present invention may, however, be embodied in many different forms and should not be construed as limited to the example embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms including technical and scientific terms used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Composition for Removing a Polymeric Contaminant

A composition according to the present invention may be used for removing a polymeric contaminant that may remain on an apparatus, or a part thereof, used for manufacturing a semiconductor device. The composition for removing a polymeric contaminant includes a fluoride salt, an acid or a salt thereof, and an aqueous solution of glycol.

The apparatus, to which the composition may be applied, may be used for forming a wiring of a semiconductor memory device. For example, the apparatus may be an etching apparatus such as a dry etching apparatus, a deposition apparatus, a cleaning apparatus, or a part thereof. An example of the part may include a transferring arm that transfers a semiconductor substrate during a dry etching process and/or a deposition process. The above-mentioned apparatus may include a material such as ceramic, aluminum, quartz, stainless metal, etc.

In example embodiments of the present invention, the polymeric contaminant may include a first etching residue originated from a photoresist pattern and a second etching residue generated from a process of etching a thin film. Examples of the polymeric contaminant may include a carbon-based polymer, a metallic polymer, an oxide polymer, etc. The polymeric contaminant may also include a fluorine atom. Additionally, the polymeric contaminant may be strongly attached to the part of the apparatus.

The composition for removing the polymeric contaminant includes from about 5 to 10 percent by weight of a fluoride salt, from about 5 to 15 percent by weight of an acid or a salt thereof, and from about 75 to 90 percent by weight of an aqueous solution of a glycol.

The aqueous solution of glycol can be a mixture of a glycol compound and water. In example embodiments of the present invention, the aqueous solution of glycol may include the glycol compound and water in a weight ratio of from about 1:1.5 to 1:2.5, and preferably in a weight ratio of about 1:2.

In example embodiments of the present invention, the glycol compound may be represented by the chemical structure of Formula 1, $$HO—(CH_2)n\text{-}OH \qquad \text{[Formula 1]}$$

wherein n is an integer of 2 to 5.

Examples of a glycol compound that may be used for the composition may include ethylene glycol, propylene glycol, butylene glycol, pentylene glycol, etc. These can be used alone or in a mixture thereof. The glycol compound may be readily miscible with water, and may prevent the part of the apparatus from being damaged or corroded while the polymeric contaminant is removed using the composition. Additionally, the glycol compound has a viscosity substantially lower than that of water. Thus, the glycol compound may improve permeability of the composition into the polymeric contaminant and accelerate removal of the polymeric contaminant from the apparatus.

When the composition includes less than about 75 percent by weight of the aqueous solution of glycol, relative amounts of the fluoride salt and the acid in the composition may excessively increase. Thus, the apparatus or the part thereof may be damaged or corroded by the composition while the polymeric contaminant is removed from the apparatus. In addition, when the amount of aqueous solution of glycol is greater than about 90 percent by weight, relative amounts of the fluoride salt and the acid in the composition may be so small that removal or decomposition of the polymeric contaminant may not be easily performed. Therefore, the composition may include the aqueous solution of glycol in a range of from about 75 to 90 percent by weight, and preferably in a range of from about 79 to 88 percent by weight.

The fluoride salt included in the composition may provide a fluorine ion that may decompose a carbon-based polymeric contaminant. Examples of the fluoride salt may include ammonium fluoride ($NH_4F$), tetramethylammonium fluoride ($(CH_3)_4NF$), tetraethylammonium fluoride ($(C_2H_5)_4NF$), tetrapropylammonium fluoride ($(C_3H_7)_4NF$), tetrabutylammonium fluoride ($(C_4H_9)_4NF$), etc. These can be used alone or in combination thereof.

The fluoride salt may have etching ability and corrosiveness with respect to metal or silicon which is substantially lower than those of hydrofluoric acid. Therefore, the fluoride salt may remove the polymeric contaminant from the apparatus through a chemical reaction, and may also prevent the apparatus, or a part thereof, from being damaged. The type or the amount of the fluoride salt included in the composition may be determined by considering the solubility of the fluoride salt in the composition and the corroded degree of the apparatus or the part thereof.

When the amount of the fluoride salt is less than about 5 percent by weight, the generation of the fluorine ion may be insufficient for removing the polymeric contaminant attached to the apparatus. Additionally, when the amount of the fluoride salt is greater than about 10 percent by weight, the part may be damaged or corroded by this composition. Thus, the composition may include the fluoride salt in a range of from about 5 to 10 percent by weight, and preferably in a range of from about 6 to 9 percent by weight.

The acid or the salt thereof included in the composition may oxidize the polymeric contaminant attached to the part to accelerate a removal or a decomposition of the polymeric contaminant. Particularly, the acid or the salt thereof may oxidize an insoluble portion of the polymeric contaminant and may promote a reaction of the fluorine ion with the polymeric contaminant. The acid or the salt thereof may have a strong oxidizing ability to oxidize the polymeric contaminant such as a metallic polymer.

In one example embodiment of the present invention, the composition may include nitric acid or sulfuric acid having a pH of from about 1 to 3. In another example embodiment of the present invention, the composition may include hydrofluoric acid. In still another example embodiment of the present invention, the composition may include ammonium nitrate, ammonium sulfate, etc.

When the amount of the acid or the salt thereof included in the composition is less than about 5 percent by weight, the composition may not sufficiently oxidize the polymeric contaminant in soluble portion of the polymeric contaminant. Additionally, when the composition includes greater than about 15 percent by weight of the acid or the salt thereof, the part of the apparatus may be unpreferably oxidized or damaged. Therefore, the composition may include the acid or the salt thereof in a range of from about 5 to 15 percent by weight, and preferably in a range of from about 6 to 12 percent by weight.

The composition including the above-mentioned components may be scarcely reacted with a ceramic material or may be slightly reacted with quartz or a stainless metal, which may be included in the apparatus or parts thereof used for manufacturing a semiconductor device. Therefore, the composition may actively remove the polymeric contaminant from the apparatus within a relatively short time, and also suppress damages to the apparatus or the parts thereof.

Method of Removing a Polymeric Contaminant

In example embodiments of the present invention, a polymeric contaminant may be removed using the above-mentioned compositions. A brush from an apparatus or parts thereof may also be employed in manufacturing a semiconductor device. The polymeric contaminant may be removed from the apparatus within a relatively short period of time without damage to the apparatus.

Figure 2:
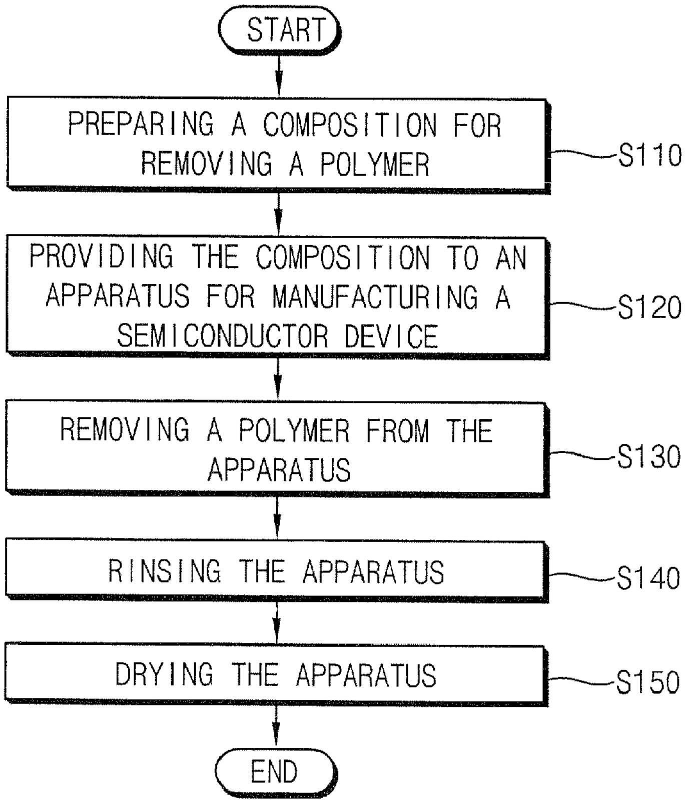
FIG. 2 is a flow chart illustrating a method of removing a polymeric contaminant from an apparatus employed in manufacturing a semiconductor device in accordance with example embodiments of the present invention.

Referring to FIG. 2, a composition for removing the polymeric contaminant can be prepared by mixing from about 5 to 10 percent by weight of a fluoride salt, from about 5 to 15 percent by weight of an acid or a salt thereof, and from about 75 to 90 percent by weight of an aqueous solution of glycol in step S110.

In example embodiments of the present invention, the composition may be prepared by mixing from about 6 to 9 percent by weight of the fluoride salt, from about 6 to 12 percent by weight of the acid or the salt thereof, and from about 79 to 88 percent by weight of the aqueous solution of glycol. The composition for removing the polymeric contaminant is previously described, so any further explanations in this regard will be omitted herein for brevity.

Subsequently, the composition is provided to the apparatus used for manufacturing a semiconductor device in step S1120.

In one example embodiment of the present invention, the composition may be provided by spraying the composition onto the apparatus or the parts thereof. In another example embodiment of the present invention, the composition may be applied by bringing the apparatus or the parts into contact with a wiper or a sponge including the composition. For example, the composition may be applied to the apparatus for from about 3 to 5 minutes. Additionally, the apparatus or the parts thereof may include a material such as ceramic, aluminum, quartz, stainless metal, etc. An example of the part may be a blade of a transferring arm.

In example embodiments of the present invention, the composition may be provided to the apparatus, parts of which may not be disassembled.

In example embodiments of the present invention, the polymeric contaminant may include a first etching residue originated from a photoresist pattern and a second etching residue generated from an etching process for a thin film. Examples of the polymeric contaminant may include a carbon-based polymer, a metallic polymer, an oxide polymer, etc. The polymeric contaminant may also include a fluorine atom. Additionally, the polymeric contaminant may be strongly adsorbed or attached to the apparatus or the part thereof.

The polymeric contaminant is removed from the apparatus by performing a cleaning process using the composition in step S130.

The cleaning process may be performed by brushing the apparatus or the parts thereof while the composition is provided to the apparatus. In the cleaning process, the composition may oxidize the polymeric contaminant attached to the part and may also accelerate decomposition of the polymeric contaminant using the fluorine component. Accordingly, the composition may remove the polymeric contaminant from the apparatus within a short period of time, for example, within from about 3 to 5 minutes. Additionally, the rapid removal of the polymeric contaminant may reduce or suppress damages to the apparatus or the parts thereof. Furthermore, the cleaning process may be performed on the apparatus, parts of which may not be disassembled, and thus the process efficiency of the cleaning process may be enhanced up to about 75% compared with a conventional cleaning process in which parts of the apparatus are dismantled.

After performing the cleaning process to remove the polymeric contaminant from the apparatus, the apparatus or the parts thereof may be rinsed using water in step S140, and may be dried in step S150. Remaining composition on the apparatus or the parts may be removed by performing the rinse process.

In the method of removing the polymeric contaminant using the composition according to the present invention, the composition may be scarcely reacted with a ceramic material, quartz or a stainless metal, which may be included in the apparatus or parts thereof used for manufacturing a semiconductor device. Therefore, the composition may actively remove the polymeric contaminant from the apparatus within a relatively short time, and also suppress damages to the apparatus or the parts thereof.

The composition and the method of removing the polymeric contaminant from the apparatus will be further described with reference to Examples and Comparative Examples, hereinafter. However, Examples are illustrative of the present invention, and thus may be embodied in many different forms and should not be construed as limiting thereof.

Preparation of a Composition for Removing a Polymeric Contaminant

Example 1

A composition for removing a polymeric contaminant from an apparatus such as a dry etching apparatus was prepared to include about 9 parts by weight of ammonium fluoride, about 10 parts by weight of nitric acid, and about 100 parts by weight of an aqueous solution of ethylene glycol. The composition was prepared by sequentially adding ammonium fluoride and nitric acid to the aqueous solution of ethylene glycol, and then by stirring the mixture at a temperature of about 20 to about 30° C. for at least about two hours. The aqueous solution of ethylene glycol included water and ethylene glycol in a weight ratio of about 2:1.

Example 2

A composition for removing a polymeric contaminant from an apparatus such as a dry etching apparatus was prepared to include about 8 parts by weight of ammonium fluoride, about 11 parts by weight of sulfuric acid and about 100 parts by weight of an aqueous solution of propylene glycol. The composition was prepared by performing processes substantially the same as those in Example 1 except for amounts and types of components. The aqueous solution of propylene glycol included water and propylene glycol in a weight ratio of about 2:1.

Example 3

A composition for removing a polymeric contaminant from an apparatus such as a dry etching apparatus was prepared to include about 10 parts by weight of tetramethylammonium fluoride, about 11 parts by weight of sulfuric acid and about 100 parts by weight of an aqueous solution of ethylene glycol. The composition was prepared by performing processes substantially the same as those in Example 1 except for amounts and types of components. The aqueous solution of ethylene glycol included water and ethylene glycol in a weight ratio of about 2:1.

Comparative Example 1

A composition for removing a polymeric contaminant from an apparatus such as a dry etching apparatus was prepared by mixing about 40 parts by weight of dimethyl sulfoxide (DMSO) and about 60 parts by weight of water.

Comparative Example 2

A composition EKC-245, which is a trade name of EKC Technologies Corporation, was prepared. The composition EKC-245 is conventionally used for removing a photoresist. The composition EKC-245 includes hydroxylamine, diglycolamine, catechol and water as its essential components.

Evaluation of Removal Abilities of Compositions

Evaluation 1

After the composition prepared in Example 1 was applied to a blade of a transferring arm for about 3 to about 4 minutes, the transferring arm was cleaned using a brush for about 3 minutes. The transferring arm was rinsed by spraying deionized water, and then was spin-dried. The blade of the transferring arm was observed using a scanning electron microscope (SEM) before and after the cleaning process was performed on the transferring arm.

Figure 3:
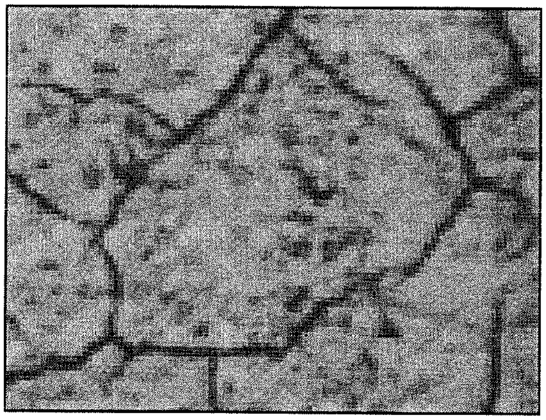
FIG. 3 is a scanning electron microscopic (SEM) photograph showing a surface of a blade of a transferring arm before a cleaning process is performed on the transferring arm.
Figure 4:
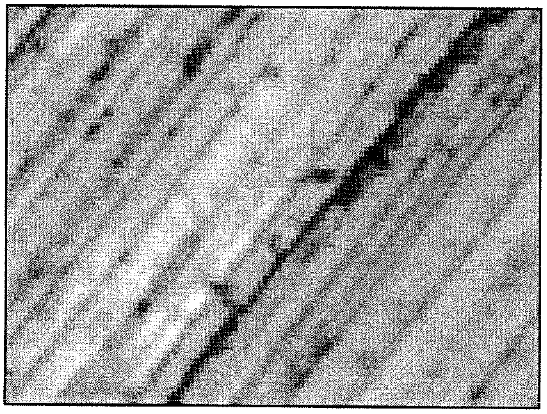
FIG. 4 is an SEM photograph showing a surface of a blade cleaned using the composition prepared in Example 1.

FIG. 3 is an SEM photograph showing a surface of the blade of the transferring arm before a cleaning process is performed on the transferring arm, and FIG. 4 is an SEM photograph showing a surface of the blade cleaned using the composition prepared in Example 1.

Referring to FIGS. 3 and 4, a carbon-based polymeric contaminant was attached to the blade in a form of a cracked film before the cleaning process was performed on the blade. The carbon-based polymeric contaminant was completely removed from the blade as shown in FIG. 4 when the blade was cleaned using the composition prepared in Example 1.

Evaluation 2

The removal ability of a polymeric contaminant was evaluated for the composition prepared in Example 2. The evaluation was carried out by a method substantially the same as that of Evaluation 1 except for a type of the composition for removing the polymeric contaminant.

Figure 5:
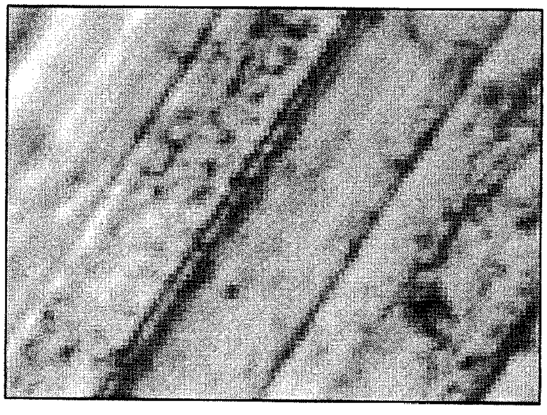
FIG. 5 is an SEM photograph showing a surface of a blade cleaned using the composition prepared in Example 2.

FIG. 5 is an SEM photograph showing a surface of a blade of a transferring arm cleaned using the composition prepared in Example 2.

As shown in FIG. 5, a carbon-based polymeric contaminant attached to the blade in a form of a cracked film was completely removed from the blade by performing the cleaning process using the composition prepared in Example 2.

Evaluation 3

The removal ability of a polymeric contaminant was evaluated for the composition prepared in Example 3. The evaluation was carried out by a method substantially the same as that of Evaluation 1 except for a type of the composition for removing the polymeric contaminant.

Figure 6:
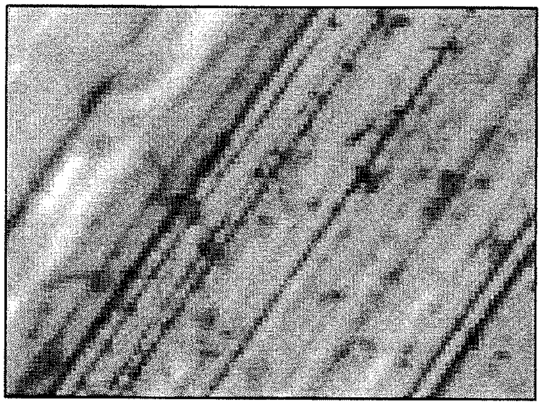
FIG. 6 is an SEM photograph showing a surface of a blade cleaned using the composition prepared in Example 3.

FIG. 6 is an SEM photograph showing a surface of a blade of a transferring arm cleaned using the composition prepared in Example 3.

As shown in FIG. 6, a carbon-based polymeric contaminant attached to the blade in a form of a cracked film was completely removed from the blade by performing the cleaning process using the composition prepared in Example 3.

Comparative Evaluations 1 and 2

The removal abilities of a polymeric contaminant were evaluated for the compositions prepared in Comparative Examples 1 and 2. The evaluation was carried out by a method substantially the same as that of Evaluation 1 except for a type of the composition for removing the polymeric contaminant.

Figure 7:
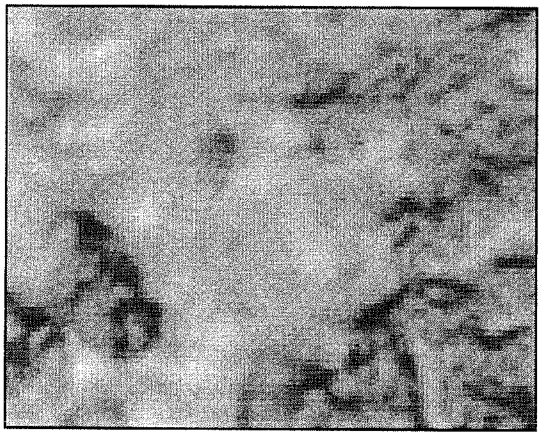
FIG. 7 is an SEM photograph showing a surface of a blade cleaned using the composition prepared in Comparative Example 1.
Figure 8:
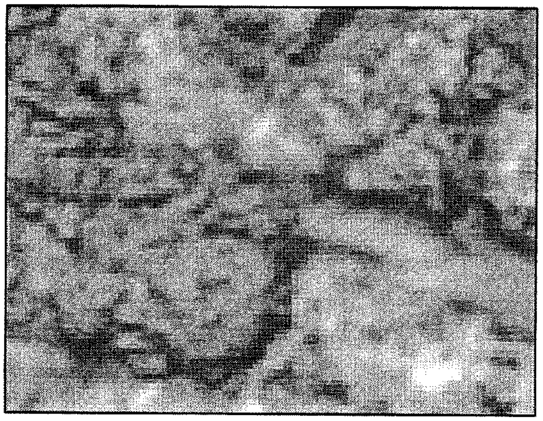
FIG. 8 is an SEM photograph showing a surface of a blade cleaned using the composition prepared in Comparative Example 2.

FIG. 7 is an SEM photograph showing a surface of a blade of a transferring arm cleaned using the composition prepared in Comparative Example 1, and FIG. 8 is an SEM photograph showing a surface of a blade of a transferring arm cleaned using the composition prepared in Comparative Example 2.

As shown in FIG. 7, a carbon-based polymeric contaminant attached to the blade was scarcely removed from the blade when the blade was cleaned using the composition prepared in Comparative Example 1. Additionally, the polymeric contaminant such as a carbon-based polymer was not removed from the blade to remain on the blade when the blade was cleaned using the composition prepared in Comparative Example 2. Therefore, it may be confirmed that the composition according to the present invention may have an enhanced removal ability of the polymeric contaminant compared with the compositions prepared in Comparative Examples 1 and 2.

According to the present invention, the composition including an aqueous solution of glycol, a fluoride salt and an acid may effectively remove a polymeric contaminant such as a carbon-based polymer from the apparatus or a part thereof, and such removal may be effected while a cleaning process is performed using a brush. Additionally, the composition may remove the polymeric contaminant from the apparatus within a relatively short period of time, and may suppress damages to parts of the apparatus. Furthermore, the cleaning process may be performed on the apparatus, parts of which are not disassembled, and thus a process efficiency of the cleaning process may be enhanced up to about 75% compared with a conventional cleaning process in which parts of the apparatus are dismantled.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A composition for removing a polymeric contaminant from an apparatus, comprising:

from about 5 to 10 percent by weight of a fluoride salt;

from about 5 to 15 percent by weight of an acid, the acid including at least one of sulfuric acid and nitric acid, or a salt thereof, the salt including at least one of ammonium sulfate and ammonium nitrate; and from about 75 to 90 percent by weight of an aqueous solution of glycol, the apparatus being employed in manufacturing a semiconductor device.

2. The composition of claim 1, wherein the aqueous solution of glycol comprises a glycol compound and water in a weight ratio of from about 1:1.5 to 1:2.5.

3. The composition of claim 2, wherein the glycol compound is represented by the chemical structure of Formula 1, $$HO—(CH_2)n\text{-}OH \quad \text{[Formula 1]}$$

wherein n is an integer of 2 to 5.

4. The composition of claim 2, wherein the glycol compound comprises at least one of ethylene glycol, propylene glycol and butylene glycol.

5. The composition of claim 1, wherein the fluoride salt comprises at least one of ammonium fluoride, tetramethylainmonium fluoride, tetraethylammonium fluoride, tetrapropylammonium fluoride and tetrabutylammonium fluoride.

6. The composition of claim 1, wherein the composition comprises:

from about 6 to 9 percent by weight of the fluoride salt;

from about 6 to 12 percent by weight of the acid or the salt thereof; and from about 79 to 88 percent by weight of the aqueous solution of glycol.

* * * * *